United States Patent [19]

Hayashi

[11] Patent Number: 6,093,597
[45] Date of Patent: Jul. 25, 2000

[54] SRAM HAVING P-CHANNEL TFT AS LOAD ELEMENT WITH LESS SERIES-CONNECTED HIGH RESISTANCE

[75] Inventor: Fumihiko Hayashi, Tokyo, Japan

[73] Assignee: NEC Corporation, Tokyo, Japan

[21] Appl. No.: 09/045,837

[22] Filed: Mar. 23, 1998

Related U.S. Application Data

[62] Division of application No. 08/816,038, Mar. 11, 1997.

[30] Foreign Application Priority Data

Oct. 31, 1995 [JP] Japan ................................ 7-282949

[51] Int. Cl.$^7$ ................................................ H01L 21/8234
[52] U.S. Cl. ........................... 438/238; 438/241; 438/953; 438/152; 438/153
[58] Field of Search .................................. 438/238, 241, 438/953, 152, 153

[56] References Cited

U.S. PATENT DOCUMENTS

| | | | |
|---|---|---|---|
| 5,198,683 | 3/1993 | Sivan | 257/67 |
| 5,404,030 | 4/1995 | Kim et al. | 257/67 |
| 5,475,240 | 12/1995 | Sakamoto | 257/67 |
| 5,594,267 | 1/1997 | Ema et al. | 257/368 |

OTHER PUBLICATIONS

K. Tsutumi et al., "A High–Performance SRAM Memory Cell with LDD–TFT Loads", *1991 Symposium on VLSI Technology Digest of Technical Papers*, pp. 23 and 24.

K. Itabashi et al., "A Split Wordline Cell for 16 Mb SRAM Using Polysilicon Sidewall Contacts", *1991 IEEE*, pp. 477–479.

*Primary Examiner*—John F. Niebling
*Assistant Examiner*—Lynne A. Gurley
*Attorney, Agent, or Firm*—Young & Thompson

[57] ABSTRACT

In an SRAM having P-channel thin film transistors formed on N-channel drive MOS transistors each of which is composed of a first gate electrode, a first drain layer and a first source layer, N-channel transfer MOS transistors each of which is composed of a second gate electrode, first and second diffusion layers, the MOS transistors are formed on a substrate. A first insulating film is formed on the driver and transfer MOS transistors. On the first insulating film, the p-channel thin film transistors are formed, each of which is composed of a third gate electrode, a second source layer functioning a power supply line pattern, a second drain layer and a gate insulator. Also, at the same time, there are formed another power supply line pattern to be connected to a second source layer of another p-channel thin film transistor, and a wiring layer to be connected to a third gate electrode of the other p-channel thin film transistor. A second insulating film including the gate insulator is formed on the load thin film transistor and the first insulating film. Subsequently, a contact is formed for connecting the wiring layer and the second drain layer of the thin film transistor to the first gate electrode of the driver transistor and the first diffusion layer of the transfer transistor and then a third insulating film is formed on the second insulating film. Then, a bit line on the third insulating film and a bit contact for connecting the bit line to the second diffusion layer.

10 Claims, 10 Drawing Sheets

SRAM HAVING P-CHANNEL TFT AS LOAD ELEMENT WITH LESS SERIES-CONNECTED HIGH RESISTANCE

CROSS-REFERENCE TO RELATED APPLICATIONS

This application is a division of copending application Ser. No. 08/816,038, filed Mar. 11, 1997.

BACKGROUND OF THE INVENTION

1. Field of the Invention

The present invention generally relates to a semiconductor memory device and a method for manufacturing such a semiconductor memory device. More specifically, the present invention relates to a static random access memory (SRAM) having P-channel thin-film transistors (TFTs) as load MOS transistors and a method of manufacturing such a static random access memory.

2. Description of the Related Art

In the presently available SRAM memory cells, the major method thereof is to use high resistance elements as load elements since the SRAM memory cells can be integrated in higher integration. However, another method using P-channel TFTs as load elements becomes more important in order to secure stabilities for soft errors caused by leakage currents, noise, or α-rays, as SRAM memory cells are made smaller and smaller, and also are made operable under further low voltages.

Referring now to FIG. 1, which illustrates an equivalent circuit diagram of a first conventional example of an SRAM memory cell, such an SRAM memory cell having P-channel MOS transistors as load elements is constructed as follows. That is, this memory cell is composed of six MOS transistors. For instance, this memory cell is composed of one pair of information transfer MOS transistors, i.e., two N-channel transfer MOS transistors TT1 and TT2, one pair of driver MOS transistors, i.e., two N-channel driver MOS transistors TD1 and TD2, and two P-channel load MOS transistors TL1 and TL2.

These six MOS transistors are connected to each other in the below-mentioned manner. The first inverter composed of MOS transistors TD1 and TL1 is cross-coupled to the second inverter composed of MOS transistors TD2 and TL2 at two connection points or nodes N1 and N2. The N-type source regions of the MOS transistors TD1 and TD2 are connected to a ground line which is applied with the voltage Vss, whereas the P-type source regions of the MOS transistors TL1 and TL2 are connected to a power supply line which is applied with the voltage Vcc. The gate electrodes of the transfer MOS transistors TT1 and TT2 are connected to a word line WL. The source regions of the transfer MOS transistors TT1 and TT2 are connected to a pair of bit lines BL1 and BL2, respectively, and the N-type drain regions of the transfer MOS transistors TT1 and TT2 are connected to the nodes N1 and N2, respectively.

When the first conventional example of the SRAM memory cell is manufactured, if the six MOS transistors TT1, TT2, TD1, TD2, TL1, and TL2 are formed on the same surface of the silicon substrate, such an SRAM memory cell having the P-channel MOS transistors as the load elements would require the cell area 1.5 to 2 times larger than that of a memory cell using high resistance elements as the load elements. Thus, the first conventional example of SRAM memory cell could not be suitably manufactured in high integration. However, if a stacking layer structure is employed as the second conventional example of SRAM memory cell described below, then the resultant SRAM memory cell can be formed with the same cell area as that of the memory cell using the high resistance elements as the load element, resulting in high integration. That is, the four N-channel MOS transistors TT1, TT2, TD1, and TD2 are formed on the silicon substrate, and the two P-channel MOS transistors TL1 and TL2 are formed as one pair of load thin-film transistors (TFTs), and are stacked on a layer composed of the N-channel MOS transistors TT1, TT2, TD1 and TD2.

Then, nowadays, such an SRAM memory cell becomes important, in which an upper gate type TFT in which the gate electrode of a thin-film transistor (TFT) is provided in an upper portion of a channel portion is employed as a load element. This is because the source/drain regions of the thin film transistor can be formed in self-alignment with the gate electrode. On the contrary, in the lower gate type thin film transistor in which the TFT gate electrode is located in the lower portion of the channel portion, the above-described source/drain cannot be formed in the self-alignment with the gate electrode. As a consequence, this SRAM memory cell cannot be suitably made very fine.

The above-described technique which employs the upper gate type thin film transistor has been reported in, for instance, 1991 Symposium on VLSI Technology Digest of Technical Papers (pages 23 to 24). Referring now to FIG. 1 corresponding to the equivalent circuit diagram of the SRAM memory cell having the P-channel MOS transistors as the load elements, and FIG. 2 schematically illustrating a cross sectional view of the SRAM memory cell, a description will be made of the second conventional example of SRAM memory cell reported in the above-described publication.

Although a plan view of the memory cell is not shown in this publication, it is conceivable that FIG. 2 is such a cross sectional view of this memory cell along a direction parallel to bit lines BL1 and BL2 involving one of nodes N1 and N2 indicated in FIG. 1. Also, it could be considered that one cross sectional view involving the node N1 has a symmetrical structure with respect to that of the other cross sectional view involving the node N2. Under such considerations, the following description is made based on such an idea that FIG. 2 is the cross sectional view, taken along the direction parallel to the bit line BL1 involving the node N1. As to the other cross sectional structure involving the node N2, the N-channel transfer MOS transistors TT1 and TT2, the N-channel driver MOS transistors TD1 and TD2, the nodes N1 and N2, and the bit lines BL1 and BL2 may be replaced with each other.

As shown in FIG. 2, field oxide films 102 and a gate oxide film 103 are formed on the surface of a silicon substrate 101. Then, a gate electrode 104 of the N-channel driver MOS transistor and a gate electrode 105 of the N-channel transfer MOS transistor are formed on the gate oxide film 103. Furthermore, N-type diffusion layers 106a and 106b are provided in self-alignment with the field oxide film 102 and the transfer transistor gate electrode 105 in an active region of the surface of the silicon substrate 101.

In this manner, the driver MOS transistor TD2 is composed of the driver transistor gate electrode 104, the gate oxide film 103, and the N-type diffusion layers (not shown) arranged along the direction perpendicular to the drawing plane of FIG. 2 to sandwich the driver transistor gate electrode 104. Also, the transfer MOS transistor TT1 is composed of the transfer transistor gate electrode 105, the N-type diffusion layer (N-type drain region) 106a, and the N-type diffusion layer (N-type source region) 106b. It should be noted that the transfer transistor gate electrode 105 functions as a word line WL, and the N-type diffusion layer 106a may be used as the drain region of the N-channel driver MOS transistor (not shown in FIG. 2).

A ground line 108 having a polycide structure is provided on the first interlayer insulating film 107 for these N-channel MOS transistors. Although not shown in this figure, this ground line 108 is connected via a ground contact hole to the N-type diffusion layers which will constitute the sources of the N-channel driver MOS transistors TD1 and TD2. Then, the surface of the first interlayer insulating film 107 involving the ground line 108 is covered with the second interlayer insulating film 109.

A node contact hole 110 and a bit line contact hole 111 are formed through the first interlayer insulating film 107 and the second interlayer insulating film 109 in such a manner that the node contact hole 110 reach the driver transistor gate electrode 104 and the N-type diffusion layer 106a, and the bit contact hole 111 reaches the N-type diffusion layer 106b. The contact plugs 112 and 113 made of the N-type doped polysilicon are formed inside these node contact hole 110 and bit contact hole 111. In this manner, the driver transistor gate electrode 104 is connected via the contact plug 112 to the N-type diffusion layer 106a inside the node contact hole 110.

A titanium silicide layer 114 is formed on the uppermost portion of the contact plug 112 in order to avoid the PN diode formed in a parasitic manner between the P-type TFT drain region and the N-type contact plug 112. At the same time, a titanium silicide layer 115 is also formed on the upper portion of the contact plug 113.

Then, the P-channel thin film transistors having an upper gate structure are formed as the load elements on the surface of the second interlayer insulating film 109. That is, the polysilicon film pattern is formed on the second interlayer insulating film 109. From this polysilicon film pattern, a high-concentration P-type polysilicon region 116 for constituting the TFT source region, the N-type polysilicon region 117 for constituting the channel region thereof, the high-concentration P-type polysilicon region 118 for constituting the drain region thereof, and the low-concentration P-type polysilicon regions 119a and 119b for constituting lightly doped drain (LDD) regions thereof are fabricated. Then, a power source wiring 121 made of a P-type polysilicon film, and TFT gate electrodes 122a and 122b are formed on the TFT gate insulating film 120. The power source wiring 121 and the TFT gate electrode 122b are connected via the contact holes to the high concentration P-type polysilicon regions 116 and 118, respectively.

As described above, the P-channel thin film transistor TL1 is composed of the gate electrode 122a, the high concentration P-type polysilicon region 116, the low concentration P-type silicon region 119a, the N-type polysilicon region 117, the low concentration polysilicon region 119b, and the high concentration P-type polysilicon region 118. The gate electrode 122b is the gate electrode of the P-channel load thin film transistor TL2.

Furthermore, the protection insulating film 123 is deposited, the third interlayer insulating film 124 is formed, and the bit line 125 is provided. In this case, the bit line 125 is connected via the contact hold to the titanium silicide 115.

Next, the conventional manufacturing method of the SRAM having the P-channel TFTs as the load elements will now be briefly explained with reference to FIGS. 3A to 3C.

FIGS. 3A to 3C are a cross sectional view for schematically representing the manufacturing sequential steps of the SRAM memory cell.

As shown in FIG. 3A, the field oxide film 102 is formed in the isolation region on the surface of the P-type silicon substrate 101, and the gate oxide film 103 is formed in the active region. The N-type polysilicon film and the tungsten silicide film are sequentially formed on the entire surface. Then, these stacked films are patterned, so that the driver transistor gate electrode 104 and the transfer transistor gate electrode 105 are formed. N-type impurity ions are implanted to form the N-type diffusion layers 106a and 106b on the surface of the P-type silicon substrate 101 using the field oxide film 102, the driver transistor gate electrode 104, and the transfer transistor gate electrode 105 as a mask.

Next, the first interlayer insulating film 107 is formed on the entire surface. After the ground contact (not shown) has been formed, the N-type polysilicon film, and the tungsten silicide film are successively formed on the overall surface. These stacked films are patterned to form the ground line 108.

Next, the second interlayer insulating film 109 having a flat surface is formed over the entire surface, and the connection contact hole 110 is formed to pass through the first and second interlayer insulating films 109 and 107, and then to reach both of the driver transistor gate electrode 104 and the N-type diffusion layer 106a. Similarly, the bit contact hole 111 is formed to reach the N-type diffusion layer 106b. The insides of this node contact hole 110 and this bit contact hole 111 are filled with the N-type polysilicon film, so that the contact plugs 112 and 113 are formed. Now, titanium is formed on the entire surface and then is subjected to heat treat, so that the titanium silicide layers 114 and 115 are formed in the self-alignment manner only on the upper portions of the contact plugs 112 and 113.

Next, the polysilicon film containing the N-type impurity ions is formed on the entire surface, and then is patterned to thereby form the N-type polysilicon region 117. The TFT gate insulating film 120 is formed on the entire surface of this N-type polysilicon region 117, and the contact hole is formed. Thereafter, the P-type polysilicon film is formed on the entire surface. Then, this silicon film is patterned to form the power source wiring 121, and the TFT gate electrodes 122a and 122b (FIG. 3A).

In this case, $BF_2$ ions corresponding to the P-type impurity are implanted at a dose of order of $3 \times 10^{13}$ cm$^{-2}$. The low concentration polysilicon regions 119'a and 119'b are formed in the self-alignment manner using the TFT gate electrode 122a as a mask (FIG. 3B).

Subsequently, a protection insulating film 123 used to form the LDD structure is formed on the entire surface, and $BF_2$ ions corresponding to the P-type impurity ions are implanted at a dose of order of $1 \times 10^{15}$ cm$^{-2}$, so that the high concentration P-type polysilicon regions 116 and 118 are formed. At this time, the following assumption is made as follows: the regions 116' and 118' which are masked and into which the impurity ions are not implanted are left in the portions covered by the power source wiring 121 and the TFT gate electrode 122b. However, since the power source wiring 121 and the TFT gate electrode 122b are made of the P-type polysilicon film, if the heat treatment is sufficiently carried out later, then the P-type impurity ions are diffused through the contact hole. As a result, these regions 116' and 118' into which the impurity ions are not implanted will disappear (FIG. 3C).

Next, the third interlayer insulating film 124 is formed on the entire surface, and then the contact hole is formed in such a manner that this contact hole passes through the third interlayer insulating film 124, the protection insulating film 123, and the TFT gate insulator 120, and thereafter reaches the titanium silicide layer 115. Finally, the bit line 125 is formed, so that the SRAM structure shown in FIG. 2 is accomplished.

In the above-described conventional SRAM memory, as shown in FIG. 3C, the regions 116' and 118' into which no impurity ion has been implanted are formed in the lower portions of the power source wiring 121 and the TFT gate electrode 122b. Also, in order to form the LDD structure in the self-alignment manner, the low concentration P-type polysilicon regions 119'a and 119'b are also formed in the edge portions of the power supply wiring 121 and the TFT gate electrode 122b. When these regions are left, these regions may function as a series resistor with respect to the P-channel load thin film transistor, so that the current drivability of the thin film transistor would be considerably lowered. For instance, a polysilicon film into which no impurity ion is implanted may represent such a very high layer resistance of on the order of $10^{12}$ $\Omega/\square$ per unit area, and a low concentration polysilicon film used in an LDD region may represent such a very high layer resistance of on the order of $10^6$ $\Omega/\square$. As previously described, in order to remove these regions, the P-type impurity ions must be necessarily diffused by sufficiently performing the heat treatment. However, such a sufficient heat treatment can be hardly applied to productions of very fine SRAMs in the future, because of the below-mentioned three reasons.

As a first reason, both N-channel MOS transistor and P-channel MOS transistor are formed under the load type P-channel thin film transistor, i.e., on silicon substrate surface. These N-channel and P-channel MOS transistors have been thermally treated during the steps such as the step for planerizing the interlayer insulating film before the load type P-channel thin film transistor is manufactured. As a consequence, since such heat treatment is carried out at high temperatures and for a long time duration after the thin film transistor has been formed, there are high risks that the characteristics of these very fine MOS transistors would be considerably deteriorated by the short channel effect.

As a second reason, in a case where the LDD structure is formed, in order that the electric field in the drain region is effectively relaxed so as to reduce leakage current of the thin film transistor, it is desired that the high concentration P-type polysilicon region 118 which will constitute the drain region is offset from the TFT gate electrode 122a. This is because if the high concentration P-type polysilicon region 118 is overlapped with the TFT gate electrode 122a, the electric field in the drain region is emphasized by receiving the influences of the electric field in the gate. To avoid such a problem, the above-described heat treatment at high temperatures and for a long time duration should be avoided, because the diffusion of the P-type impurity ions contained in the high concentration P-type polysilicon region 118 should be reduced as much as possible.

As a third reason, the titanium silicide layers 114 and 115 are formed in the upper portions of the contact plugs 112 and 113. When these titanium silicide layers 114 and 115 are thermally treated at high temperatures and for a long time duration, the film aggregation will occur, resulting in a rapid increase of the resistance.

Accordingly, the above-described conventional SRAM memory cell has the various problems. That is, the regions 116' and 118' into which no impurity ion has been implanted, and the low concentration P-type polysilicon regions 119'a and 119'b are easily left in the conventional SRAM memory cell. Thus, the parasitic resistance is increased, and the current drivability of the load type P-channel thin film transistor is considerably lowered.

Also, in the conventional SRAM memory cell, if the contact hole is formed out of either the power supply wiring 121 or the TFT gate electrode 122b, when the power supply wiring 121 and the TFT gate electrodes 122a and 122b are patterned, the polysilicon film which will constitute the main body of the thin film transistor is also etched away during the etching treatment. As a consequence, when this contact hole is formed, the anisotropic dry etching is required. Thereafter, a photoresist film is removed by way of oxygen plasma, and cleaning treatment is carried out by using ammonia and sulfuric acid, so that a native oxide film is formed in the contact hole. If the polysilicon film is directly deposited on this native oxide film, then no electric conductivity could be established between the power supply wiring 121, the TFT gate electrode 122b, and the high concentration P-type polysilicon regions 116 and 118. To avoid this difficulty, an oxide film etching must be lightly carried out by using diluted hydrofluoric acid as the pretreatment of forming the polysilicon. As a result, the TFT gate insulator 120 is locally made thinner. Thus, there is another problem that a break down voltage failure of the gate insulator may readily occur.

These problems are caused by the manufacturing method itself, but also the structure of the semiconductor memory device.

SUMMARY OF THE INVENTION

The present invention is made in the light of abovementioned circumstances. An object of the present invention is to provide a manufacturing method and structure for an SRAM having upper gate type P-channel thin film transistors as load elements which are formed on N-channel MOS transistors, wherein high series-connected resistance is not formed at each of nodes such as nodes N1 and N2 in FIG. 1 and a gate break down voltage of each of the thin film transistor is not degraded.

In order to achieve an aspect of the present invention, a semiconductor device includes a first pattern of a first MOS transistor formed on a semiconductor substrate, wherein the first pattern is composed of a first gate pattern and first diffusion layer patterns on a first pattern plane, a second pattern of a second MOS transistor formed on the semiconductor substrate when the second pattern is composed of a second gate pattern and second diffusion layer patterns on the first pattern plane, a third pattern of a first field effect transistor formed on a first insulating film which is formed on the first and second MOS transistors when the third pattern is composed of a third gate pattern, a first channel pattern and first source/drain patterns on a second pattern plane, and the third gate pattern is provided above the first channel pattern, a fourth pattern extending onto one of the first source/drain patterns on the second pattern plane, and a first contact pattern provided on both of the one first source/drain pattern and the fourth pattern on the second pattern plane.

The semiconductor device may further include a fifth pattern of a second field effect transistor formed on the first insulating film, wherein the fifth pattern is composed of a fourth gate pattern, a second channel pattern and second source/drain patterns on the second pattern plane, the fourth gate pattern is provided above the second channel pattern, the fourth pattern is a part of the fourth gate pattern, and the third gate pattern extends onto one of the second source/ drain patterns, and a second contact pattern provided on both of the one second source/drain pattern and the fourth gate pattern on the second pattern plane.

In this case, when the first gate pattern extends to one of the second diffusion layer patterns and the second gate pattern extends to one of the first diffusion layer patterns, the semiconductor device may further includes a third contact pattern provided on both of the one second diffusion layer pattern and the first gate pattern on the first pattern plane, and a fourth contact pattern provided on both of the one first diffusion layer pattern and the second gate pattern on the first pattern plane, and the third and fourth contact patterns correspond to the first and second contact patterns, respectively.

The first and second MOS transistors are n-channel MOS transistors, and first and second field effect transistors are p-channel thin film transistors, and the one first diffusion layer pattern and the one second diffusion layer pattern are first and second drain patterns, respectively, and the other of the first diffusion layer patterns and the other of the second diffusion layer patterns are first and second source patterns, respectively. Also, the one first source/drain pattern and the one second source/drain pattern are first and second thin film transistor drain patterns, respectively, and the other of the first source/drain patterns and the other of the second source/drain patterns are first and second source thin film transistor patterns, respectively. In addition, the second drain pattern, the first gate pattern, the first thin film transistor drain pattern and the fourth gate pattern are connected by the first and third contact patterns, and the first drain pattern, the second gate pattern, the second thin film transistor drain pattern and the third gate pattern are connected by the second and fourth contact patterns, whereby a static memory cell is formed to have p-channel load transistors.

The semiconductor device may further include a sixth pattern of a first transfer transistor formed on the semiconductor substrate, wherein the sixth pattern is composed of a fifth gate pattern as a first word line pattern, the first drain pattern and a third diffusion layer pattern on the first pattern plane, a seventh pattern of a second transfer transistor formed on the semiconductor substrate, wherein the seventh pattern is composed of a sixth gate pattern as a second word line pattern, the second drain pattern and a fourth diffusion layer pattern on the first pattern plane, and the first and second word lines are connected in common, a first bit pattern formed on a second insulating film which is formed on the first and second field effect transistors, wherein the first bit pattern is composed, on a third pattern plane, of a first bit line pattern and the third contact pattern for connecting the third diffusion layer pattern to the first bit line pattern, a second bit pattern formed on the second insulating film, when the second bit pattern is composed, on the third pattern plane, of a second bit line pattern and a fourth contact pattern for connecting the fourth diffusion layer pattern to the second bit line pattern, a first power supply pattern formed on the second pattern plane and connected to the first source thin film transistor pattern, and a second power supply pattern formed on the second pattern plane and connected to the second source thin film transistor pattern, the first power supply pattern and the second power supply pattern are connected in common.

In this case, in the semiconductor device, the first and second word line patterns are arranged in a horizontal direction of the first pattern plane, and the first and second gate patterns are arranged between the first and second word line patterns in a vertical direction in the first pattern plane. Also, the sixth and seventh patterns are arranged in the vertical direction in the first pattern plane, and the first and second power supply patterns are arranged above the first and second word line patterns in the horizontal direction of the second pattern plane, respectively. Further, the third and fifth patterns are arranged above the first and second patterns between the first and second power supply patterns in the vertical direction in the second pattern plane, respectively, and connected to the first and second power supply patterns, respectively, and the first and second bit patterns are arranged above the third and fifth patterns in the vertical direction in the third pattern plane, respectively.

In order to achieve another aspect of the present invention, a semiconductor device having a structure includes an n-channel driver MOS transistor formed on a semiconductor substrate to have a first gate electrode, a first drain layer and a first source layer, an n-channel transfer MOS transistor formed on the semiconductor substrate to have a second gate electrode, first and second diffusion layers, a first insulating film formed on the driver and transfer MOS transistors, a p-channel load thin film transistor formed on the first insulating film to have a third gate electrode, a second source layer, a second drain layer connected to the first gate electrode and the first diffusion layer, and a gate insulator, a fourth gate electrode which is the gate electrode of the other thin film transistor, a second insulating film including the gate insulator and formed on the load thin film transistor and the first insulating film, a contact provided through the second insulating film, so as to connect the fourth gate electrode to the second drain layer of the load thin film transistor.

In order to achieve still another aspect of the present invention, a method of manufacturing a semiconductor memory device, includes the steps of:

forming on a semiconductor substrate an n-channel driver MOS transistor having a first gate electrode, a first drain layer and a first source layer and an n-channel transfer MOS transistor having a second gate electrode, first and second diffusion layers;

forming a first insulating film on the driver and transfer MOS transistors;

forming, on the first insulating film, a p-channel load thin film transistor having a third gate electrode, a second source layer functioning a power supply line pattern, a second drain layer connected to the first gate electrode and the first diffusion layer, and a gate insulator, and a fourth gate electrode of the other load thin film transistor;

forming a second insulating film including the gate insulator on the load thin film transistor and the first insulating film;

forming a contact for connecting the fourth gate electrode to the second drain layer of the load thin film transistor which is connected to the first gate electrode of the driver transistor and the first diffusion layer of the transfer transistor;

forming a third insulating film on the second insulating film; and forming a bit line on the third insulating film and a bit contact for connecting the bit line to the second diffusion layer.

DETAILED DESCRIPTION OF THE PREFERRED EMBODIMENTS

Next, a static random access memory (SRAM) of the present invention will be described below in detail with reference to the accompanying drawings.

Figure 4:
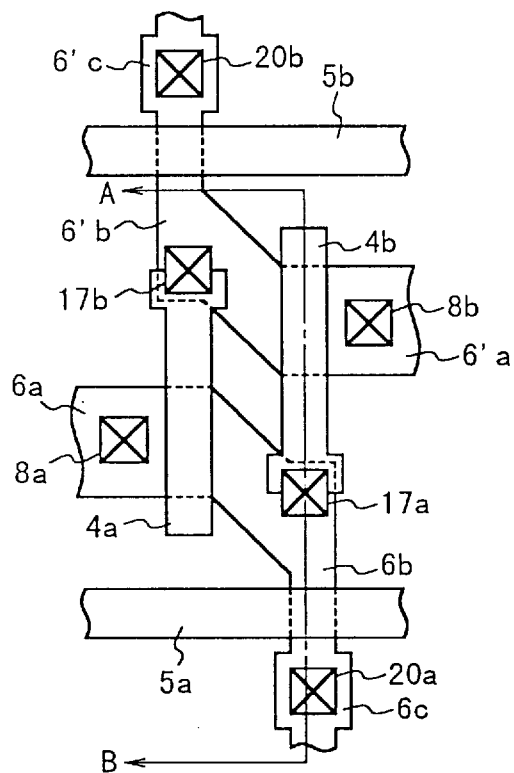
FIG. 4 is a plan view for N-channel driver MOS transistors and N-channel transfer MOS transistors of the SRAM having the P-channel MOS transistors as load elements according to a first embodiment of the present invention.
Figure 5:
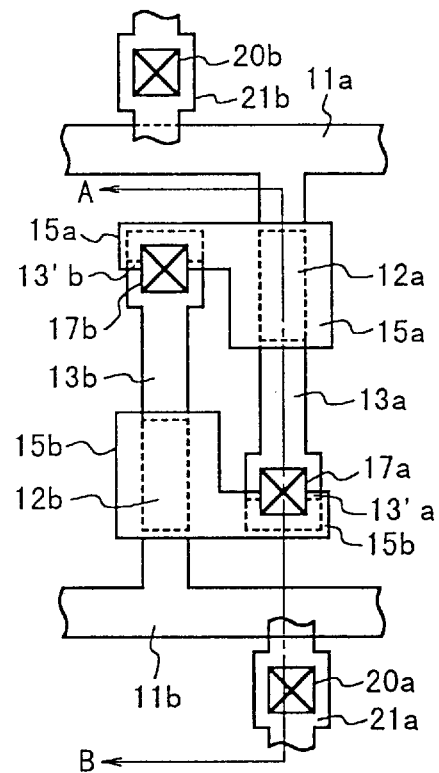
FIG. 5 is a plan view for P-channel load MOS transistors of the SRAM in the first embodiment.
Figure 6:
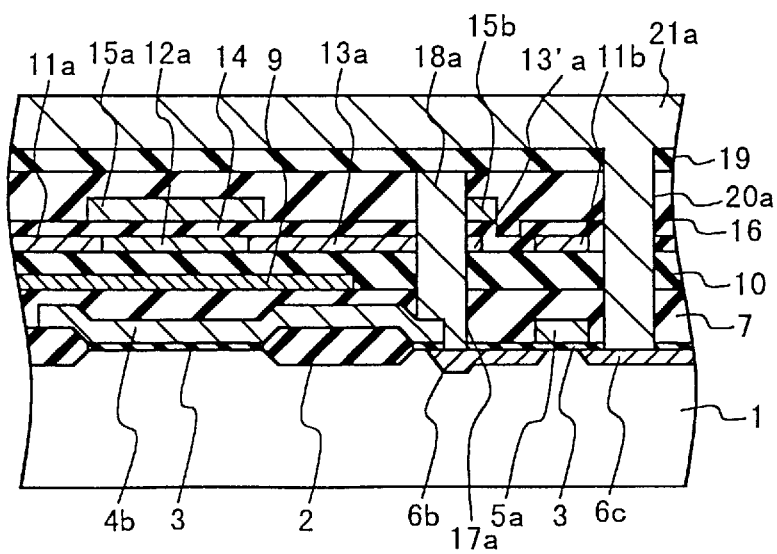
FIG. 6 is a cross sectional view of the memory cell of the SRAM in the first embodiment.

FIG. 4 is a plan view for N-channel driver MOS transistors and N-channel transfer MOS transistors of the SRAM having the P-channel MOS transistors as load elements according to a first embodiment of the present invention. FIG. 5 is a plan view for P-channel load MOS transistors of the SRAM in the first embodiment. FIG. 6 is a cross sectional view of the memory cell of the SRAM in the first embodiment. It should be noted that since the forming steps of the above-described N-channel driver MOS transistor, N-channel transfer MOS transistor, and ground line are similar to those of the second conventional example, these forming steps will be briefly explained below.

As shown in FIGS. 4, 5 and 6, a field oxide film 2 and a gate oxide film 3 are formed on an isolation region and an active region of a surface of a P-type silicon substrate 1. Then, driver transistor gate electrodes 4a and 4b and transfer transistor gate electrodes 5a and 5b are formed via the gate oxide film 3 on the surface of the silicon substrate 1. Furthermore, N-type diffusion layers 6a, 6b, 6c, 6'a, 6'b and 6'c are provided in the active region of the surface of the silicon substrate 1.

In this manner, a first N-channel driver MOS transistor TD1 is composed of the driver transistor gate electrode 4a, the gate oxide film 3, and the N-type diffusion layers 6a and 6b. Also, a second N-channel driver MOS transistor TD2 is composed of the driver transistor gate electrode 4b, the gate oxide film 3, the N-type diffusion layer 6'a, and the N-type diffusion layer 6'b. Furthermore, a first transfer MOS transistor TT1 is composed of the transfer transistor gate electrode 5a, the gate oxide film 3, the N-type diffusion layer 6b, and the N-type diffusion layer 6c. In addition, a second transfer MOS transistor TT2 is composed of the transfer transistor gate electrode 5a, the gate oxide film 3, the N-type diffusion layer 6'b, and the N-type diffusion layer 6'c. It should be noted that the transfer transistor gate electrodes 5a and 5b may have another function of a word line WL, and are connected to each other outside the memory cell.

These four N-channel MOS transistors are covered with a first interlayer insulating film 7 having a flat surface. As shown in FIG. 4, ground contact holes 8a and 8b which reach the N-type diffusion layer 6a and 6'a are formed in this first interlayer insulating film 7. Then, the N-type diffusion layers 6a and 6'a are connected via these ground contact holes 8a and 8b to a ground line 9, as shown in FIG. 6. Then, the surface of the first interlayer insulating film 7 involving the ground line 9 is covered by a second interlayer insulating film 10 having a flat surface.

As shown in FIGS. 5 and 6, first and second polysilicon film patterns made of a first polysilicon film are formed on the surface of the second interlayer insulating film 10. The first polysilicon film pattern is composed of a high concentration P-type polysilicon region 11a which will constitute a source region of one P-channel load thin film transistor (TFT), an N-type polysilicon region 12a corresponding to an N-type channel region of the thin film transistor, and a high concentration P-type polysilicon region 13a corresponding to a drain region of the thin film transistor. Then, as shown in FIG. 5, the second polysilicon film pattern is composed of a high concentration P-type polysilicon region 11b which will constitute a source region of another P-channel load thin film transistor, an N-type polysilicon region 12b corresponding to an N-type channel region of the thin film transistor, and a high concentration P-type polysilicon region 13b corresponding to a drain region of the thin film transistor. It should also be noted that the high concentration P-type polysilicon regions 11a and 11b may constitute a portion of power supply wiring, respectively, and are connected to each other outside the memory cell.

As shown in FIG. 6, a TFT gate insulator 14 is formed on the surfaces of the first and second polysilicon film patterns and the surface of the second interlayer insulating film 10. Furthermore, TFT gate electrodes 15a and 15b made of the second polysilicon film are formed on this TFT gate insulator 14. In accordance with the above-described manner, one P-channel load thin film transistor TL1 is composed of the TFT gate electrode 15a, the TFT gate insulator 14, and the high concentration P-type polysilicon regions 11a and 13a. The other P-channel load thin film transistor TL2 is composed of the TFT gate electrode 15b, the TFT gate insulator 14, and the high concentration P-type polysilicon regions 11b and 13b.

Then, as shown in FIG. 6, a third interlayer insulating film 16 having a flat surface is deposited on the surfaces of the TFT gate electrodes 15a and 15b, and the surface of the TFT gate insulator 14. Subsequently, as shown in FIG. 6, a first node contact hole 17a is formed in such a manner that this first node contact hole 17a passes through the third interlayer insulating film 16, the TFT gate electrode 15b, the TFT gate insulator 14, the high concentration P-type polysilicon region 13a, the second interlayer insulating film 10, the first interlayer insulating film 7, and the gate oxide film 3, and also reaches both of the driver transistor gate electrode 4b and the N-type diffusion layer 6b. Similar to the above node contact hole 17a, as shown in FIG. 6, a second node contact hole 17b is formed in such a manner that this second node contact hole 17b passes through the third interlayer insulating film 16, the TFT gate electrode 15a, the TFT gate insulator 14, the high concentration P-type polysilicon region 13b, the second interlayer insulating film 10, the first interlayer insulating film 7, and the gate oxide film 3, and also reaches both of the driver transistor gate electrode 4a and the N-type diffusion layer 6'b.

Figure 1:
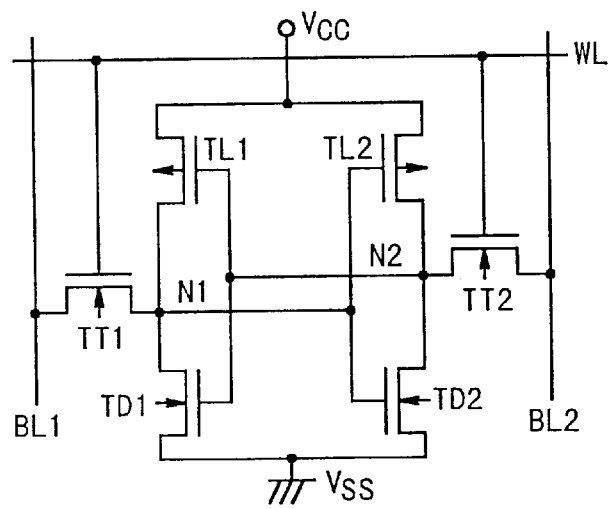
FIG. 1 is a circuit diagram illustrating a memory cell of a first conventional example of static random access memory (SRAM)

As shown in FIG. 6, either a contact plug 18a or 18b (not shown) is formed inside these node contact holes 17a and 17b. The N-type diffusion layer 6b, the driver transistor gate electrode 4b, the high concentration P-type polysilicon region 13a, and the TFT gate electrode 15b are connected to each other by the contact plug 18a to thereby construct a node N1 in FIG. 1. Similarly, the N-type diffusion layer 6'b, the driver transistor gate electrode 4a, the high concentration P-type polysilicon region 13b, and the TFT gate electrode 15a are connected to each other by the other contact plug 18b (not shown) to thereby construct a node N2. It should be understood that a major feature of the present invention is given as follows. That is, the TFT gate electrode 15b is so arranged that it is overlapped with the node contact hole 17a on the side of the node contact hole 17a, and also is not projected toward the TFT gate electrode 15a. Also, the gate electrode 15a is so arranged that it is overlapped with the node contact hole 17b on the side of the node contact hole 17b, and also is not projected toward the TFT gate electrode 15b.

Then, as shown in FIG. 6, a fourth interlayer insulating film 19 is deposited on the surfaces of the contact plugs 18a, 18b, and the surface of the third interlayer insulating film 16. Furthermore, bit contact holes 20a and 20b are formed in such a manner that these bit contact holes pass through the fourth interlayer insulating film 19, the third interlayer insulating film 16, the TFT gate insulator 14, the second interlayer insulating film 10, the first interlayer insulating film 17, and the gate oxide film 3, and then reach the N-type diffusion layers 6c and 6'c. A bit line 21a (BL1) and a bit line 21b (BL2) are connected via these contact holes 20a and 20b to the N-type diffusion layers 6c and 6'c.

Next, a description will now be made of a method for manufacturing the SRAM memory cell according to the first preferred embodiment of the present invention with reference to FIGS. 7A to 7F. FIGS. 7A to 7F are sectional views for illustrating manufacturing processes of the SRAM memory cell, and show one set of a pair of inverters and a pair of N-channel transfer MOS transistors. The following description is made of the manufacturing processes for this one set, and since the manufacturing processes for the other set are similar thereto, no further explanation thereof is made in the specification.

Figure 7A:
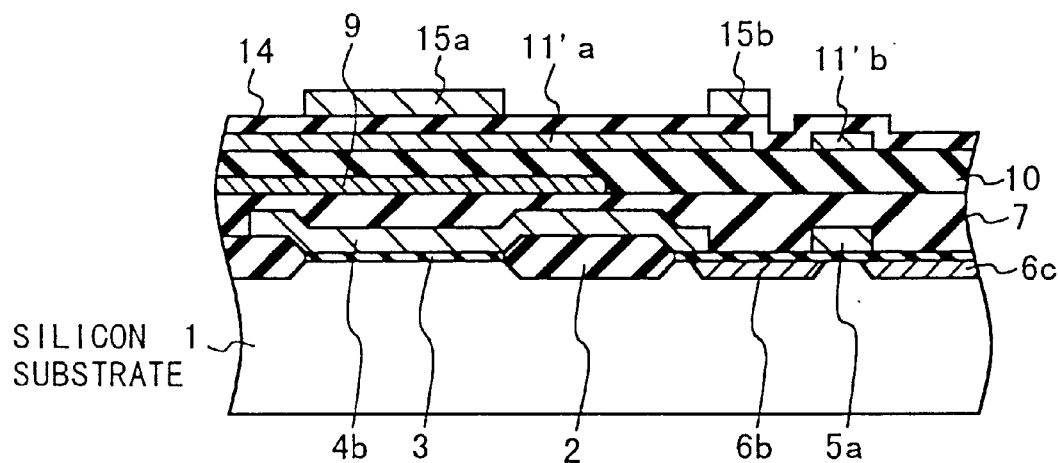
FIGS. 7A to 7F are cross sectional views of the memory cell of the SRAM in the first embodiment in the manufacturing process.

As shown in FIG. 7A, the field oxide film 2 having a thickness of approximately 400 nm is firstly formed on the isolation region of the surface of the P-type silicon substrate 1 by utilizing the local oxidation (LOCOS) method and the like. Then, the gate oxide film 3 having a thickness of 10 nm is formed on the active region by way of a thermal oxidation method and the like. Next, an N-type polysilicon film having a thickness of about 100 nm is formed on the entire surface by employing, for instance, the low pressure chemical vapor deposition (LPCVD) method and the ion implantation method. Subsequently, a tungsten silicide film having a thickness of about 100 nm is formed on the entire surface by employing, for instance, a sputtering method. This stacked layer is patterned by using an anisotropic reactive ion etching (RIE) method, so that the driver transistor gate electrode 4b and the transfer transistor gate electrode 5a, which have the polycide structures, are formed.

Arsenic ions are implanted by using the field oxide film 2, the driver transistor gate electrode 4b, and the transfer transistor gate electrode 5a as a mask. As are result, the N-type diffusion layers 6b and 6c having concentration of about $10^{20}$ to $10^{21}$ cm$^{-3}$ are formed on the surface of the P-type silicon substrate 1.

Next, the first interlayer insulating film 7 having a flat surface, and a bottom surface made of oxide film at least is formed on the entire surface by employing, for example, the LPCVD method and a chemical mechanical polishing (CMP) method. This first interlayer insulating film 7 is formed in the below-mentioned manner. For instance, a silicon oxide film having a thickness of about 100 nm is formed on the entire surface by way of the LPCVD method, and subsequently, a boron-phosphorus silicate glass (BPSG) film having a thickness of 600 nm is formed by way of the LPCVD method and the like. Subsequently, after these films are thermally treated at the temperature range from, for example, 800° C. to 850° C., the surfaces thereof are made flat by way of the CMP method. A ground contact hole (not shown in detail) which may reach the N-type drain diffusion layer is formed in the first interlayer insulating film 7 by way of the RIE method. Then, an N-type polysilicon film having a thickness of approximately 100 nm is formed on the entire surface by way of the LPCVD method and the ion implantation method, and furthermore, a tungsten silicide film having a thickness of approximately 100 nm is formed on the entire surface by using the LPCVD method. Then, the ground line 9 having the polycide structure is patterned by way of the RIE method.

Next, the second interlayer insulating film 10 having a flat surface and at least an upper layer made of a silicon oxide film is formed on the entire surface by way of the LPCVD method, the CMP method and so on. This second interlayer insulating film 10 is manufactured in a similar manner to that of the first interlayer insulating film.

Next, an amorphous silicon film having a thickness of about 40 nm is formed by way of the LPCVD method and the like on the entire surface of this second interlayer insulating film 10. This amorphous silicon film is thermally treated for about 10 hours at temperatures of approximately 600° C., so that this amorphous silicon film is changed into a polysilicon film. Furthermore, N-type impurity ions are implanted into this polysilicon film, which will become an N-type polysilicon film (namely, the above-described first polysilicon film) having concentration of $10^{16}$ to $10^{18}$ cm$^{-3}$. This first polysilicon film is patterned by way of the RIE method to thereby form the first polysilicon film pattern 11'a and the second polysilicon film pattern 11'b. Then, the TFT gate insulator 14 having a thickness of about 15 nm is formed on the entire surface by way of the LPCVD method. Further, either the above-described N-type or P-type second polysilicon film having concentration of $10^{16}$ to $10^{19}$ cm$^{-3}$ is formed on the entire surface by way of the LPCVD method, the ion implantation method, and so on. Then, this second polysilicon film is patterned by way of the RIE method to thereby the TFT gate electrode 15a and the TFT gate electrode 15b (FIG. 7A).

Figure 7B:
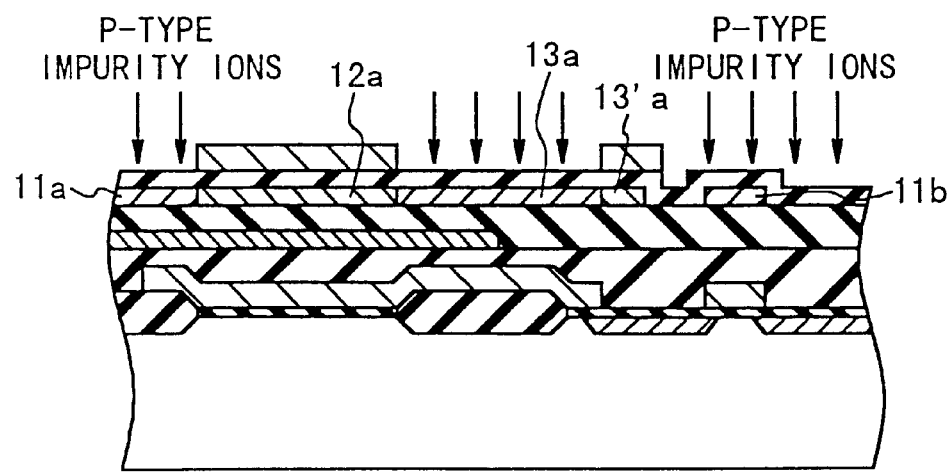

Next, P-type impurity ions are implanted into the entire surface by using the TFT gate electrodes 15a and 15b as a mask, so that the high concentration P-type polysilicon regions 11a, 11b, and 13a are formed in self-alignment with the TFT gate electrodes 15a and 15b. In the first polysilicon film pattern 11'a, both the N-type polysilicon region 12a and the region 13'a into which no impurity ion is implanted, which will constitute channel regions of thin film transistor respectively, are left in the portions covered by the TFT gate electrodes 15a and 15b (FIG. 7B). Also, in the second polysilicon film pattern 11'b, a similar case may occur, although not shown in the figures.

Figure 7C:
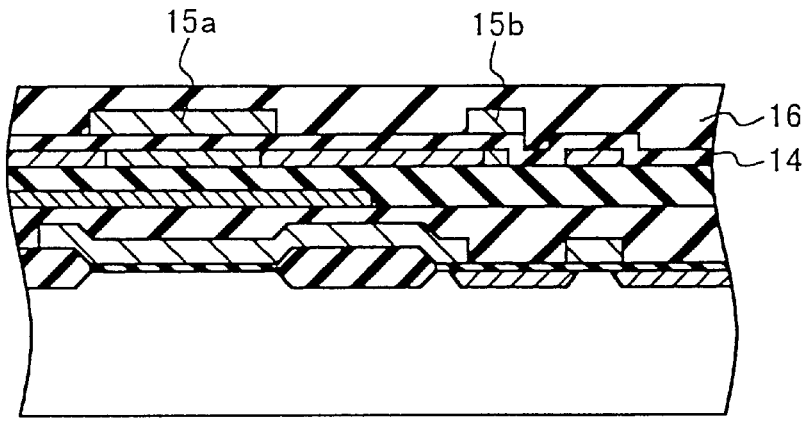

Next, the third interlayer insulating film 16 is formed on the entire surface by way of, for instance, the LPCVD method and the CMP method. This third interlayer insulating film 16 may be formed in a similar manner to that of the first interlayer insulating film 7 (FIG. 7C). Subsequently, with employment of the RIE method, the first node contact hole 17a is formed in such a manner that this first node contact hole 17a passes through the third interlayer insulating film 16, the TFT gate electrode 15b, the TFT gate insulator 14, the high concentration P-type polysilicon region 13a, the region 13'a into which no ions are implanted, the second interlayer insulating film 10, the first interlayer insulating film 7, and the gate oxide film 3, and also reaches both of the driver transistor gate electrode 4b and the N-type diffusion layer 6b. At this time, in the vicinity of the node contact hole 17a, the TFT gate electrode 15b is overlapped with the node contact hole 17a, and is so arranged on the side along the direction of the TFT gate electrode 15a that the TFT gate electrode 15b does not project from this node contact hole 17a.

Figure 7D:
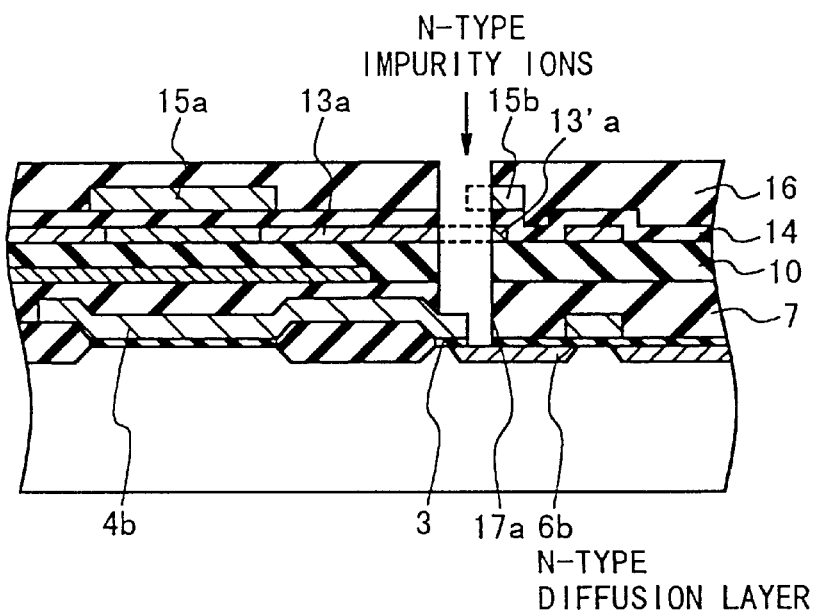

The node contact hole 17a is formed in accordance with the following manner. For example, the third interlayer insulating film 16 is etched away by employing etching gas of $CHF_3$ in the RIE method. Then, the TFT gate electrode 15b is etched away by using etching gas such as HBr and $Cl_2$ in the RIE method, and the TFT gate insulator 14 is etched away by employing etching gas such as $CHF_3$ in the RIE method. Subsequently, both the high concentration P-type polysilicon region 13a and the region 13'a into which no impurity is implanted are etched away by way of the RIE method with employment of etching gas such as HBr and $Cl_2$. Finally, the second interlayer insulating film 10, the first interlayer insulating film 7, and the gate oxide film 3 are sequentially etched away by way of the RIE with using etching gas such as $CHF_3$. In this case, in order to prevent increase of a leakage current in the diffusion layer when the node contact hole 17a is overlapped with the edge of the field oxide film 2 due to misalignment, N-type impurity ions such as phosphorus ions or arsenic ions are implanted through the node contact hole 17a (FIG. 7D).

Figure 7E:
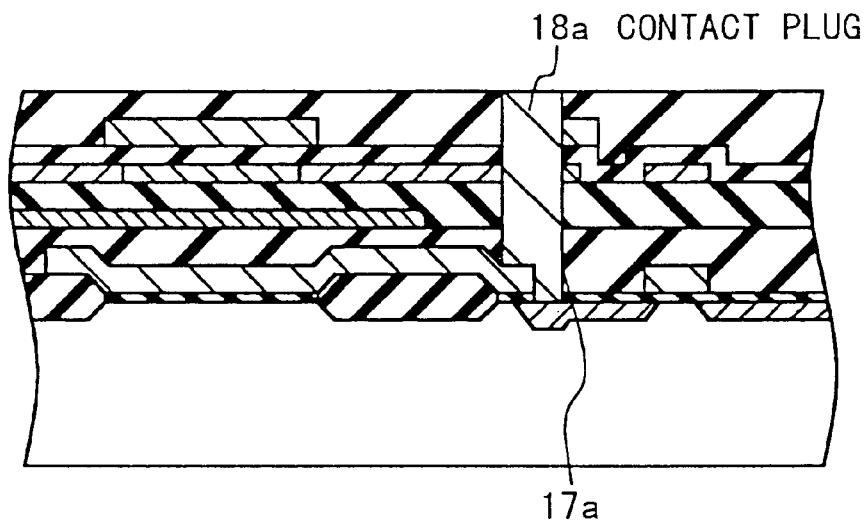

Next, as shown in FIG. 7E, the contact plug 18a is formed inside the node contact hole 17a. This contact plug 18a is formed in the following manner. That is, for instance, an N-type polysilicon film having impurity concentration of $10^{19}$ to $10^{21}$ cm$^{-3}$ is firstly formed on the entire surface by way of the LPCVD method, the ion implantation method, and so on. It is desirable to make the film thickness of this polysilicon film substantially equal to a diameter of the node contact hole. Then, the polysilicon film is entirely etched away by way of the isotropic dry etching method, so that the contact plug 18a made of polysilicon is formed only inside the node contact 17a.

Alternatively, this contact plug 18a may be formed. First, in order to prevent tungsten from being reacted with silicon, a titanium film having a thickness of about 50 nm, and a titanium nitride film having a thickness of about 100 nm are sequentially formed on the entire surface as a barrier metal by using the sputtering method. Subsequently, a tungsten film is grown on the entire surface by using the LPCVD method. A thickness of this tungsten film is desirably selected to be substantially equal to the diameter of the contact hole. Then, the entire surfaces of the above-described tungsten film, titanium nitride film, and titanium film are successively etched away by way of the isotropic etching method, so that the contact plug 18a made of these refractory metals is formed only within the node contact 17a (FIG. 7E).

Next, the fourth interlayer insulating film 19 having a thickness of about 100 nm is formed on the entire surface by way of the LPCVD method and the like. This fourth interlayer insulating film 19 may be made of a silicon oxide film, or a BPSG film. However, in the case that this contact plug 18a is made of such a refractory metal as tungsten, this contact plug 18a is formed by way of either the normal pressure CVD method or the plasma CVD method, while the upper limit temperature is selected to be approximately 500° C.

Figure 7F:
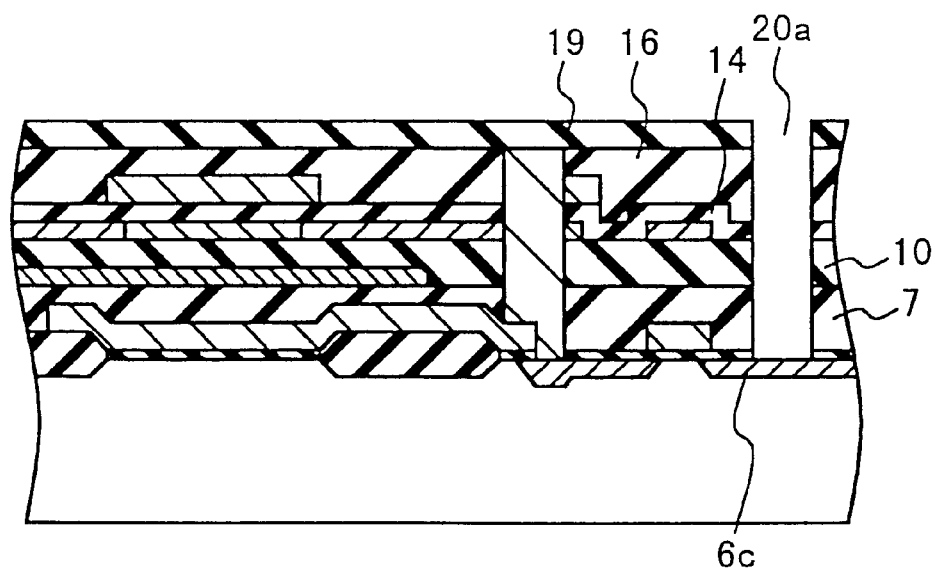

Next, the bit contact hole 20a is formed by way of the RIE method in such a manner that this bit contact hole 20a passes through the fourth interlayer insulating film 19, the third interlayer insulating film 16, the TFT gate insulator 14, the second interlayer insulating film 10, the first interlayer insulating film 7, and the gate oxide film 3, and then reaches the N-type diffusion layer 6c (FIG. 7F).

Furthermore, a titanium film having a thickness of approximately 50 nm, and a titanium nitride film having a thickness of approximately 100 nm are successively formed on the entire surface by way of the sputtering method, so that a tungsten film is grown on the entire surface by the LPCVD method. A thickness of this tungsten film is preferably selected to be substantially equal to the diameter of the contact hole. Then, the above-described tungsten film, titanium nitride film, and titanium film are sequentially etched away by employing the isotropic etching method, so that a contact plug (not shown) made of tungsten is formed only inside the bit contact hole 20a. The titanium film, the titanium nitride film, and an aluminium film are successively formed on the entire surface. These aluminium film, titanium nitride film, and titanium film are sequentially patterned so as to form the bit line 21a shown in FIG. 6. As a result, the memory cell of the SRAM according to the present invention is fabricated.

In accordance with the above-described structure and manufacturing method of the present invention, the region into which no impurity ion is implanted is never left between the high-concentration P-type polysilicon region 13a or 13b, which will constitute the P-type drain region of the P-channel load thin film transistor, and the contact plug 18a or 18b. As a consequence, even when the heat treatment is carried out under low temperatures and within short time duration in the fabrication of the upper gate type thin film transistor, there is no problem that the current drivability of the thin film transistor is extremely lowered due to the parasitic resistance.

Also, after the node contact hole 17a or 17b is formed and a photoresist is removed, the surface of the TFT gate insulator 14 is not exposed. Accordingly, even when a native oxide film, which has been formed by removing the photoresist by using the oxygen plasma method and by cleaning, is removed by using diluted hydrofluoric acid, there are no problem that the TFT gate insulator is locally made thinner, or contaminated. Then, there is no problem that the TFT gate insulator break down voltage is extremely deteriorated.

Furthermore, if the contact plug 18a or 18b is formed by employing the refractory metal such as tungsten, then there is no possibility that a PN diode is formed in the portion of the node contact hole in a parasitic manner, which can avoid that the current drivability of thin film transistor is lowered.

Figure 8:
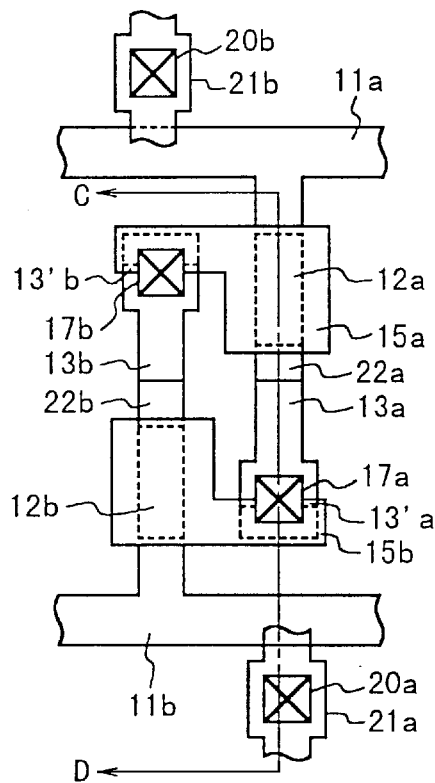
FIG. 8 is a plan view for P-channel load MOS transistors of the SRAM having the P-channel MOS transistors as load elements according to a second embodiment of the present invention.
Figure 9:
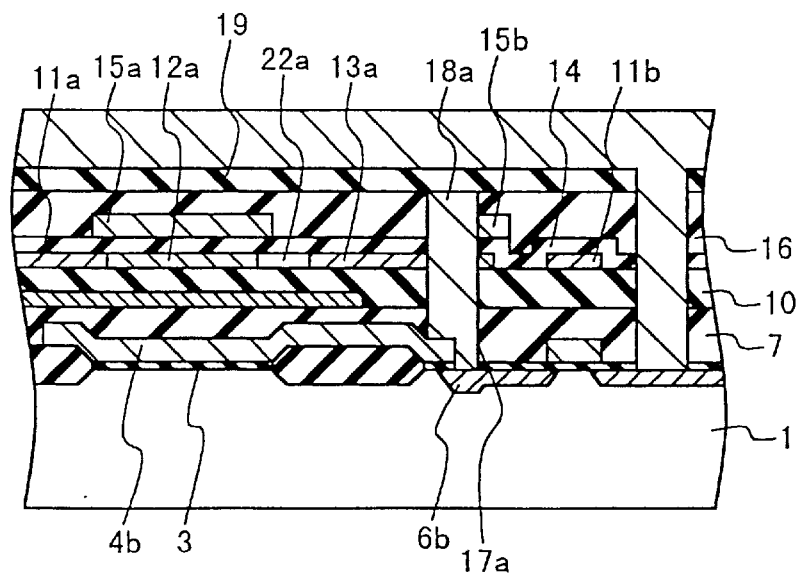
FIG. 9 is a cross sectional view of the memory cell of the SRAM in the second embodiment.

Referring now to FIGS. 8 and 9, another memory cell of the SRAM according to the second embodiment of the present invention will be described. In accordance with the first embodiment, the SRAM memory cell employs the thin film transistor having the single drain structure as the load element. In accordance with the second embodiment, the SRAM memory cell employs a thin film transistor having such a lightly doped offset (LDO) structure as a load element. In this LDO structure, an offset is provided in a drain portion, and a low-concentration P-type region is formed therein. FIG. 8 is a plan view for showing the SRAM memory cell, and FIG. 9 is a cross sectional view for representing the SRAM memory cell, taken along a line C–D of FIG. 8. In this embodiment, since the structure of this SRAM memory cell is identical to that of the first embodiment except for the P-channel load thin film transistor portion of this SRAM memory cell, explanations thereof will be made in a simple manner.

As shown in FIG. 9, the N-channel driver MOS transistor and the N-channel transfer MOS transistor, which constitute the SRAM memory cell, are covered with the second interlayer insulating film 10 having a flat surface, as previously described.

As shown in FIGS. 8 and 9, first and second polysilicon film patterns made of the first polysilicon film are formed on the surface of the second interlayer insulating film 10. The first polysilicon film pattern is composed of a high concentration P-type polysilicon region 11a which will constitute the source region of one P-channel load thin film transistor, and the N-type polysilicon region 12a corresponding to the N-type channel region of the thin film transistor, a low concentration P-type polysilicon region 22a, and the high concentration P-type polysilicon region 13a corresponding to the drain region of the thin film transistor. Similarly, the second polysilicon film pattern is composed of a high concentration P-type polysilicon region 11b which will constitute a source region of the other P-channel load thin film transistor, the N-type polysilicon region 12a corresponding to the N-type channel region of the thin film transistor, a low concentration P-type polysilicon region 22b, and the high concentration P-type polysilicon region 13a corresponding to a drain region of thin film transistor. It should also be noted that the high concentration P-type polysilicon regions 11a and 11b may constitute a portion of power supply wiring, respectively, and are connected to each other outside the memory cell.

As shown in FIG. 9, the TFT gate insulator 14 is formed on the surfaces of the first and second polysilicon film patterns, and the surface of the second interlayer insulating film 10. Furthermore, the TFT gate electrodes 15a and 15b made of the second polysilicon film are formed on this TFT gate insulator 14.

In accordance with the above-described manner, one P-channel load thin film transistor TL1 is composed of the TFT gate electrode 15a, the TFT gate insulator 14, the high concentration P-type polysilicon regions 11a and 13a and the low concentration P-type polysilicon region 22a. The other P-channel load thin film transistor TL2 is composed of the TFT gate electrode 15b, the TFT gate insulator 14, and the high concentration P-type polysilicon regions 11b and 13b, and the low concentration P-type polysilicon region 22b.

Next, as shown in FIG. 9, the third interlayer insulating film 16 having a flat surface is deposited on the surfaces of the TFT gate electrodes 15a and 15b, and the surface of the TFT gate insulator 14.

Next, the first node contact hole 17a is formed in such a manner that this first node contact hole 17a passes through the third interlayer insulating film 16, the TFT gate electrode 15b, the TFT gate insulator 14, the high concentration P-type polysilicon region 13a, a region 13' into which no impurity ion is implanted, the second interlayer insulating film 10, the first interlayer insulating film 7, and the gate oxide film 3, and also reaches both of the driver transistor gate electrode 4b and the N-type diffusion layer 6b. Similarly, as shown in FIG. 9, a second node contact hole 17b is formed.

As shown in FIGS. 8 and 9, either the contact plug 18a or 18b (not shown) is formed inside these node contact holes 17a and 17b. The N-type diffusion layer 6b, the driver transistor gate electrode 4b, the high concentration P-type polysilicon region 13a, and the TFT gate electrode 15b are connected to each other by the contact plug 18a to thereby construct the node N1. Similarly, the N-type diffusion layer 6'b, the driver transistor gate electrode 4a, the high concentration P-type polysilicon region 13b, and the TFT gate electrode 15b are connected to each other by the other contact plug 18b to thereby construct another node N2.

Next, as shown in FIG. 9, the fourth interlayer insulating film 19 is deposited on the surfaces of the contact plugs 18a and 18b, and the surface of the third interlayer insulating film 16. Thereafter, similar to the first embodiment, the bit contact hole is formed and then the bit line is formed.

As the method for manufacturing such that the drain region of the P-channel load thin film transistor is formed to have the LDO structure, boron impurity ions are selectively implanted by using the resist pattern formed in the normal photolithography technique.

In accordance with such a structure/manufacturing method of the second embodiment, it is possible to realize the SRAM memory cell having the thin film transistor of the LDO-structure as the load element capable of relaxing the electric field in the drain region and also of securing the current drivability, as compared with the single drain structure. At this time, since the high concentration P-type polysilicon regions 13a and 13b, and also the low concentration P-type polysilicon regions 22a and 22b are formed in self-alignment with the TFT gate electrode, the controlability of the channel length can be improved. There is no such a problem that the current drivability of the thin film transistor is extremely lowered due to the parasitic resistance produced in the node contact hole portion. Also, there is no problem such that the gate insulator break down voltage is extremely deteriorated.

Figure 10:
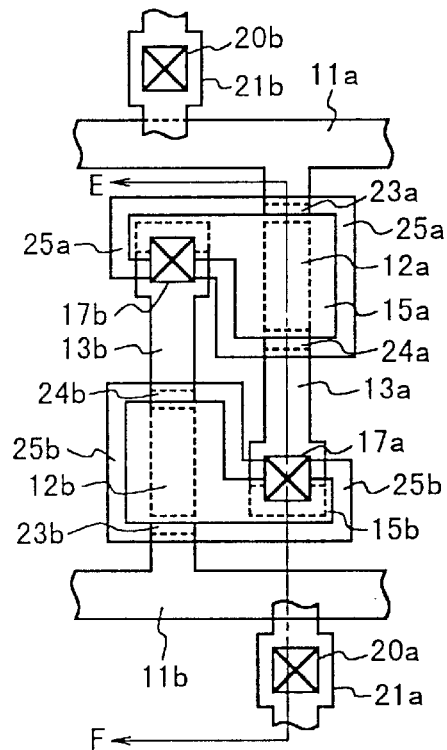
FIG. 10 is a plan view for P-channel load MOS transistors of the SRAM having the P-channel MOS transistors as load elements according to a third embodiment of the present invention.
Figure 11:
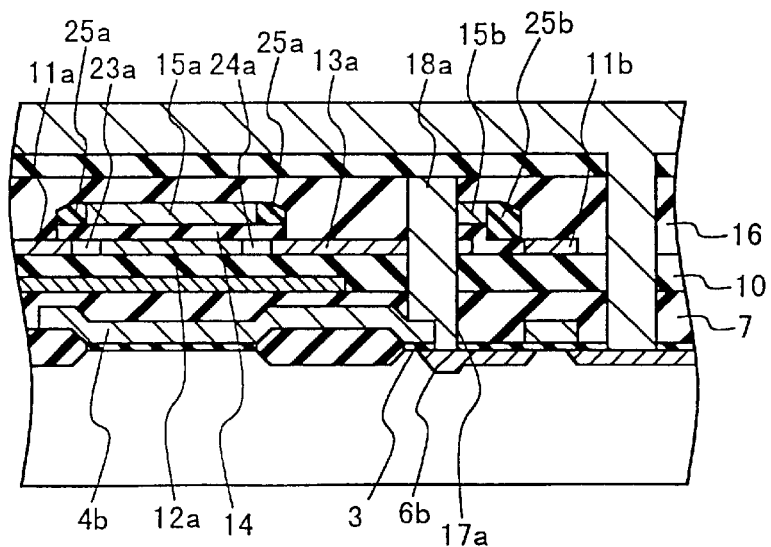
FIG. 11 is a cross sectional view of the memory cell of the SRAM in the third embodiment.
Figure 12:
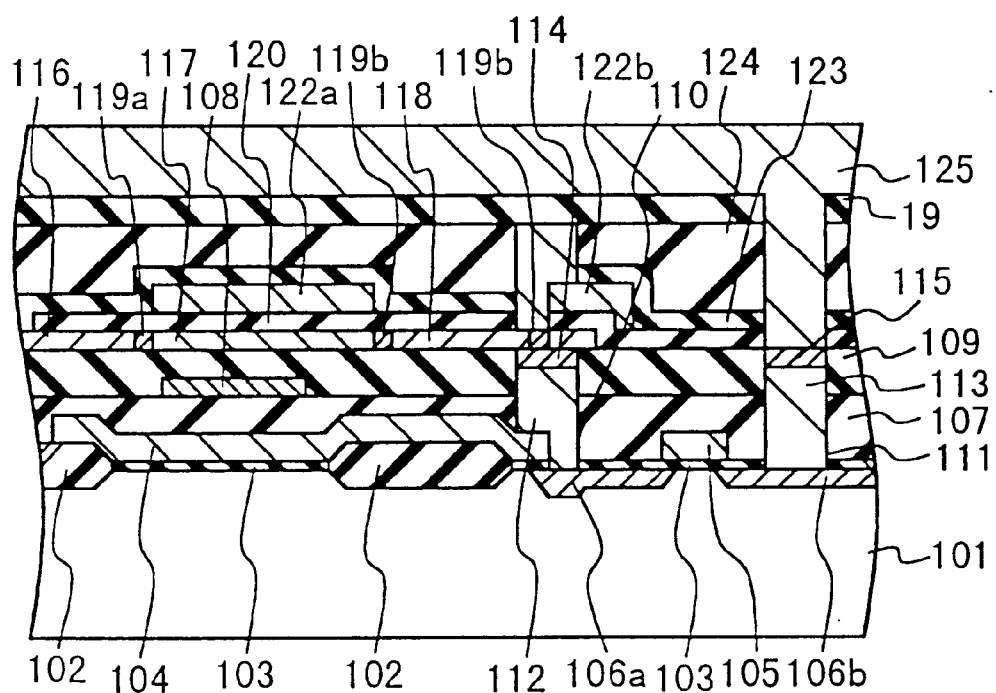
FIG. 12 is a cross sectional view of the memory cell of the SRAM having the P-channel MOS transistors as load elements according to a fourth embodiment of the present invention.

Referring now to FIGS. 10 and 11, another SRAM memory cell according to the third embodiment of the present invention will be described. This SRAM memory cell has such an LDD structure that the source/drain regions of the P-channel load thin film transistor is formed in self-alignment with the TFT gate electrode. FIG. 10 is a plan view for representing the SRAM memory cell of the third embodiment, and FIG. 11 is a cross sectional view for showing the SRAM memory cell, taken along a line E–F of FIG. 10. Also, since the structure of this SRAM memory cell of the third embodiment is identical to that of the first embodiment except for the P-channel load thin film transistor portion thereof, explanations thereof will be briefly made.

As shown in FIG. 11, the N-channel driver MOS transistor and the N-channel transfer MOS transistor, which constitute the SRAM memory cell, are covered with the second interlayer insulating film 10 having a flat surface. As shown in FIGS. 10 and 11, first and second polysilicon film patterns made of the first polysilicon film are formed on the surface of the second interlayer insulating film 10. The first polysilicon film pattern is composed of the high concentration P-type polysilicon region 11a which will constitute the source region of one P-channel load thin film transistor, a low concentration P-type polysilicon region 23a, the N-type polysilicon region 12a corresponding to an N-type channel region of the thin film transistor, the low concentration P-type polysilicon region 24a, and the high concentration P-type polysilicon region 13a corresponding to the drain region of the thin film transistor. Then, as shown in FIG. 10, the second polysilicon film pattern is composed of the high concentration P-type polysilicon region 11b which will constitute the source region of the other P-channel load thin film transistor, a low concentration P-type polysilicon region 23b, the N-type polysilicon region 12b corresponding to the N-type channel region of the thin film transistor, the low concentration P-type polysilicon region 24b, and the high concentration P-type polysilicon region 13b corresponding to the drain region of the thin film transistor. It should also be noted that the high concentration P-type polysilicon regions 11a and 11b may constitute a portion of power supply wiring, respectively, and are connected to each other outside the memory cell.

As shown in FIG. 11, the TFT gate insulator 14 is formed on the surface of the second polysilicon film pattern and the surface of the second interlayer insulating film 10. Furthermore, the gate electrodes 15a and 15b made of the second polysilicon film are formed on this TFT gate insulator 14. Then, side wall insulating films 25a and 25b are formed on side walls of these TFT gate electrodes 15a and 15b.

In accordance with the above-described manner, one P-channel load thin film transistor TL1 is composed of the TFT gate electrode 15a, the TFT gate insulator 14, the high concentration P-type polysilicon regions lla and 13a, and the low concentration polysilicon regions 23a and 24a. The other P-channel load thin film transistor TL2 is composed of the TFT gate electrode 15b, the TFT gate insulator 14, the high concentration P-type polysilicon regions 11b and 13b, and also the low concentration P-type polysilicon regions 23b and 24b. Then, as shown in FIG. 11, the third interlayer insulating film 16 having a flat surface is deposited on the surfaces of the TFT gate electrodes 15a and 15b.

Next, the first node contact hole 17a is formed in such a manner that this first node contact hole 17a passes through the third interlayer insulating film 16, the TFT gate electrode 15b, the side wall insulating film 25b, the high concentration P-type polysilicon region 13a, the second interlayer insulating film 10, the first interlayer insulating film 7, and the gate oxide film 3, and also reaches both of the driver transistor gate electrode 4b and the N-type diffusion layer 6b. Similar to the above node contact hole 17a, as shown in FIG. 10, the second node contact hole 17b is provided.

As shown in FIG. 11, either the contact plug 18a or 18b (not shown) is formed inside these node contact holes 17a and 17b. The N-type diffusion layer 6b, the driver transistor gate electrode 4b, the high concentration P-type polysilicon region 13a, and the TFT gate electrode 15b are connected to each other by the contact plug 18a to thereby construct the node N1. Similarly, the N-type diffusion layer 6'b, the driver transistor gate electrode 4a, the high concentration P-type polysilicon region 13b, and the TFT gate electrode 15a are connected to each other by the other contact plug 18b (not shown) to thereby construct the node N2. Then, as shown in FIG. 11, the fourth interlayer insulating film 19 is deposited on the surface of the contact plug 18a or 18b, and the surface of the third interlayer insulating film 16. Thereafter, bit contact holes 20a and 20b are formed in a similar manner to that of the first and second embodiments. Then, the bit line is formed.

As the method for manufacturing that the source/drain regions of the P-channel load thin film transistor has such a LDD structure, the following ion implantation method is employed. That is, boron ions corresponding to the P-type impurity are implanted into the overall surface by using the side wall insulating film formed on the side wall of the gate electrode as a mask. In this manufacturing method, the side wall insulating films are normally formed by the forming of the silicon oxide film on the entire surface and the anisotropic RIE method.

In accordance with such a structure/manufacturing method of the third embodiment, it is possible to realize the SRAM memory cell having thin film transistor of the LDD-structure as the load element capable of relaxing the electric field in the drain region and also of securing the current drive capability, as compared with the single drain structure. At this time, since the high concentration P-type polysilicon regions, and also the low concentration P-type polysilicon regions are formed in self-alignment with the TFT gate electrode, the control characteristics of the channel length and the length of the LDD region can be improved. There is no such a problem that the current drivability of the thin film transistor is extremely lowered due to the parasitic resistance produced in the node contact hole portion. Also, there is no problem such that the gate breakdown voltage is extremely deteriorated.

Since the side wall insulating films 25a and 25b are formed, the regions into which no impurity ion is implanted is readily formed in the conventional method, and thus the parasitic resistance is further increased. As a result, it is rather difficult to form such an LDD structure in accordance with the prior art. In accordance with the third embodiment, however, this problem can be readily solved, so that the LDD structure can be simply manufactured.

As previously described, in the semiconductor memory device according to the present invention, the SRAM memory cell is composed of the four N-channel MOS transistors formed on the surface of the substrate, and also one pair of upper gate type P-channel thin film transistors formed on the surface of the interlayer insulating film for covering these N-channel MOS transistors. In this SRAM memory cell, the node contact holes are formed at the node contact portion where one pair of CMOS inverters are cross-coupled to each other in such a manner that each of these node contact holes pass through the interlayer insulating films for covering the P-channel thin film transistor, the gate electrode of the P-channel thin film transistor, the gate insulator of the P-channel thin film transistor, the P-type drain region of the P-channel thin film transistor, the interlayer insulating films for covering the four N-channel MOS transistors formed on the substrate surface, and the gate oxide films of the N-channel MOS transistors, and then reach the gate electrode of the N-channel MOS transistor and the N-type drain region. The cross-coupling is carried out by the contact plugs provided inside the node contact holes. The SRAM memory cell has such a structure that the gate electrode of one P-channel thin film transistor is overlapped with the node contact holes in the vicinity of the node contact holes, and does not project toward the gate electrode of the other thin film transistor.

As a consequence, in the stage for manufacturing either the P-type source/drain regions of the P-channel thin film transistor or the P-type LDD region in the self-alignment manner, the region into which no impurity ion is implanted is not left between the P-type drain region and the contact plugs. Even when the heat treatment is carried out at the lower temperatures and within the short time duration, it is possible to avoid such a problem that the current drivability by the thin film transistor is extremely lowered due to the parasitic resistance. For instance, when the parasitic resistance is produced in the conventional SRAM memory cell, this resistance value may be probably increased up to approximately $10^{10}$ Q/□ as the sheet resistance value. The current drivability of the load element would be limited not by the ON current of the thin film transistor, but by this parasitic resistance, i.e., would be lowered in a range of $10^{-10}$ to $10^{-9}$ A. However, according to the present invention, since this parasitic resistance is removed, then the current drivability of the load element can be originally determined by the ON current of the thin film transistor. Accordingly, the load element can supply such a higher current than $10^{-7}$ A.

Also, after the node contact hole is formed and the photoresist is removed, the TFT gate insulator is not exposed from the surface. Accordingly, even when the native oxide film, which has been formed by removing the photoresist by using the oxygen plasma method and by cleaning, is removed by using diluted hydrofluoric acid, there are no problems that the TFT gate insulator is locally made thinner, or contaminated. Then, there is no problem such that the TFT gate insulator break down voltage is extremely deteriorated.

Furthermore, if the contact plug is formed by employing the refractory metal such as tungsten, then there is no possibility that any PN diode is formed in the portion of the node contact hole in the parasitic manner, which can avoid that the current drivability of the thin film transistor is lowered.

Figure 2:
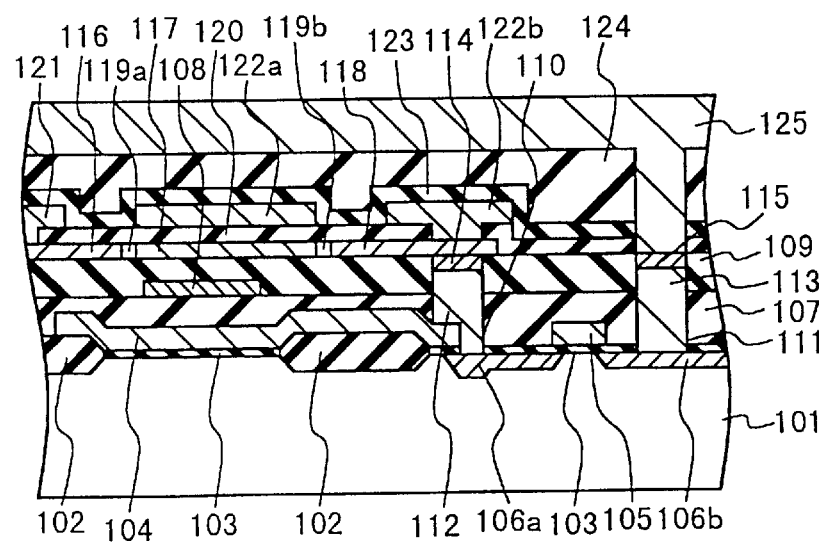
FIG. 2 is a cross sectional view of a memory cell of a second conventional example of SRAM.
Figure 3A:
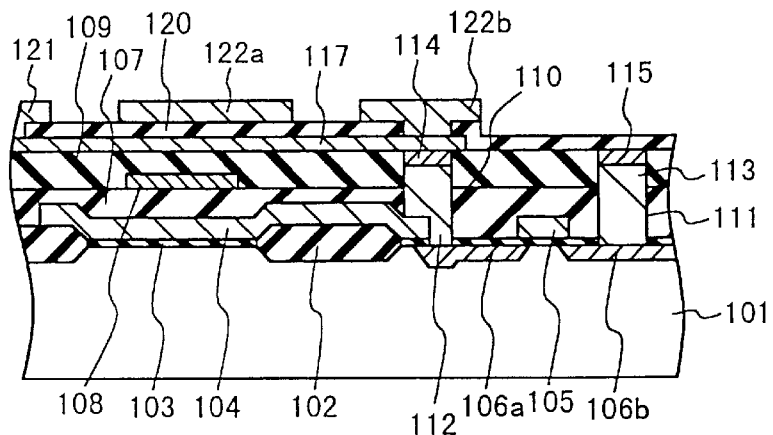
FIGS. 3A to 3C are cross sectional views illustrating the memory cell of the second conventional example of SRAM shown in FIG. 2 in the manufacturing process.
Figure 3B:
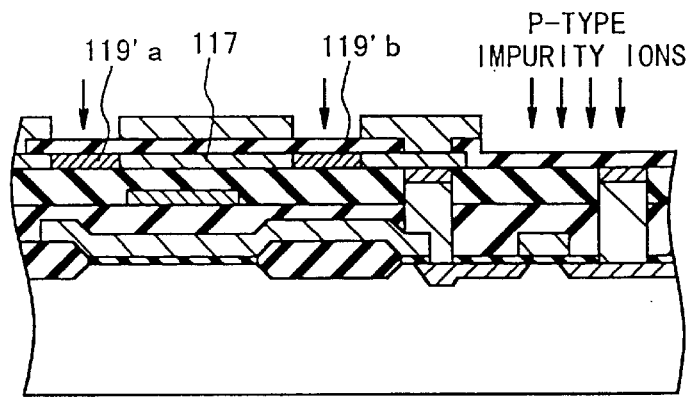
Figure 3C:
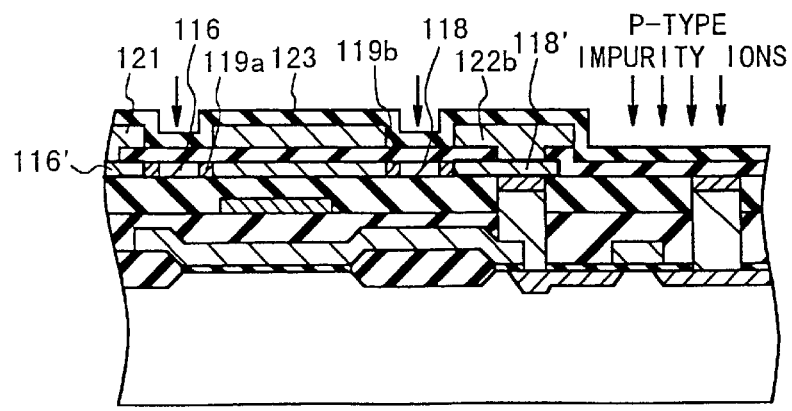

Next, the SRAM according to the fourth embodiment of the present invention will be described below with reference to FIG. 12 and FIGS. 13A to 13C. In the fourth embodiment, the manufacturing processes until the gate insulator 120 is formed are the same as those of the second conventional example shown in FIG. 2. In the fourth embodiment, TFT gate electrodes 122a and 122b are formed, so that the TFT gate electrode 122b does not totally cover the titanium silicide layer 114.

Figure 13A:
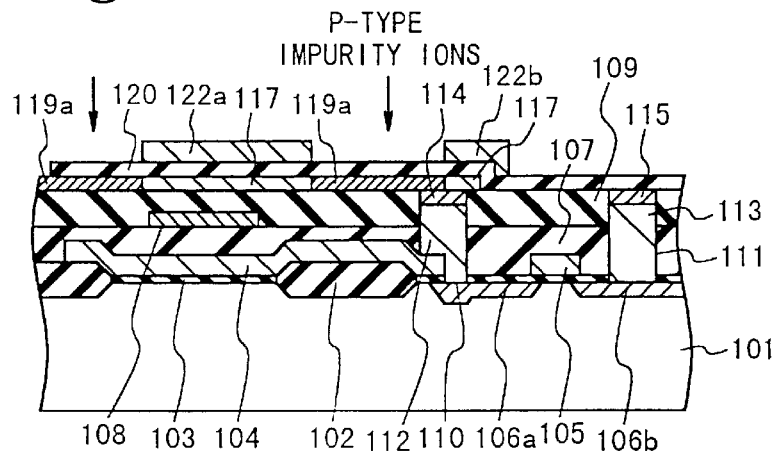
FIGS. 13A to 13C are cross sectional views of the memory cell of the SRAM in the fourth embodiment in the manufacturing process.
Figure 13B:
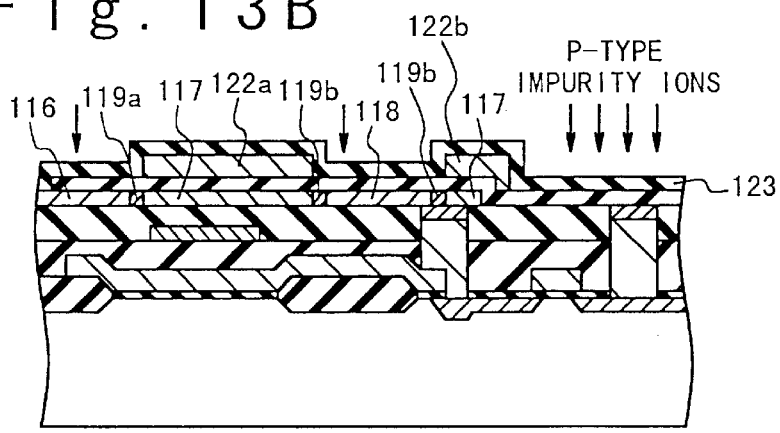
Figure 13C:
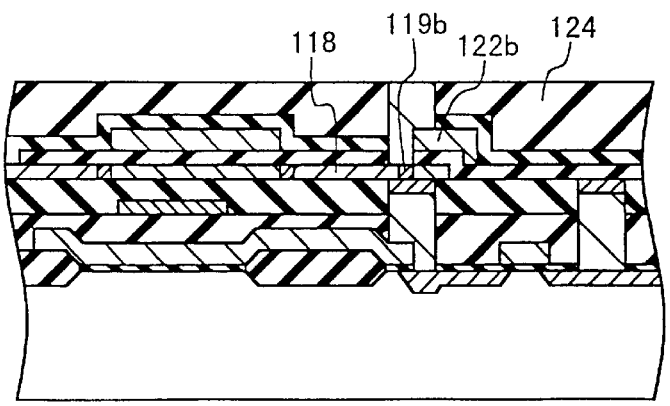

Next, P-type impurity ions are implanted as shown in FIG. 13A. Then, an insulating film 123 is deposited. Again, P-type impurity ions are implanted to form an LDD structure. Subsequently, the third insulating film 124 is formed and a contact hole is formed to pass the third insulating film 124, the insulating film 123, and the TFT gate insulator 120, and to reach both of the TFT drain region 118 and the TFT gate electrode 122b. The contact hole is filled with the conductive film such as a polysilicon film. Subsequently, the fourth insulating film 19 is formed and then the bit line 125 and the bit contact are formed as in the above embodiments. In this case, the bit contact reaches the silicide layer 114 and thus the bit line 125 can be connected to the diffusion layer 106b.

What is claimed is:

1. A method of manufacturing a semiconductor memory device, comprising the steps of:

forming on a semiconductor substrate an n-channel driver MOS transistor having a first gate electrode, a first drain layer and a first source layer and an n-channel transfer MOS transistor having a second gate electrode, first and second diffusion layers;

forming a first insulating film on said driver and transfer MOS transistors;

forming, on said first insulating film, a p-channel load thin film transistor having a third gate electrode, a second source layer functioning as a power supply line pattern, a second drain layer and a gate insulator, a fourth gate electrode of another load thin film transistor extending to the second drain layer;

forming a second insulating film contacting said third gate electrode and including said gate insulator on said load thin film transistor and said first insulating film;

forming a contact for connecting said second drain layer of said load thin film transistor and said fourth gate electrode of said another load thin film transistor to said first gate electrode of said driver transistor and said first diffusion layer of said transfer transistor;

forming a third insulating film on said second insulating film; and forming a bit line on said third insulating film and a bit contact for connecting said bit line to said second diffusion layer.

2. A method according to claim 1, wherein said step of forming a contact includes:

forming a first contact section contacting with said first gate electrode of said driver transistor and said first diffusion layer of said transfer transistor, said second drain layer of said load thin film transistor being formed in contact with said first contact section; and forming a second contact section for contacting said second drain layer to said fourth gate electrode of said another load thin film transistor.

3. A method according to claim 2, wherein said step of forming a first contact section includes:

forming a contact hole to penetrate said first insulating film to said first gate electrode of said driver transistor and said first diffusion layer of said transfer transistor;

filling said contact hole with a conductive material; and forming a conductive top layer of a refractory material such as tungsten silicide or a titanium silicide.

4. A method according to claim 1, wherein said step of forming a contact includes:

forming a contact hole to penetrate said first and second insulating films to said first gate electrode of said driver transistor and said first diffusion layer of said transfer transistor; and filling said contact hole with a conductive material.

5. A method according to claim 1, wherein said step of forming a bit contact includes:

forming a first bit contact section connected to said second diffusion layer of said transfer transistor; and forming a second contact section for connecting said bit line to said to said first bit contact section.

6. A method according to claim 5, wherein said step of forming a first contact section includes:

forming a bit contact hole to penetrate said first insulating film to said second diffusion layer of said transfer transistor;

filling said bit contact hole with a conductive material; and forming a conductive top layer of a refractory material such as tungsten silicide or a titanium silicide.

7. A method according to claim 1, wherein said step of forming a bit contact includes:

forming a contact hole to penetrate said first to third insulating films to said second diffusion layer of said transfer transistor; and filling said contact hole with a conductive material.

8. A method according to claim 1, wherein said step of forming a p-channel load thin film transistor includes:

forming an n-type conductive layer on said first insulating film;

patterning said n-type conductive layer to form a conductive layer portion and another power supply line pattern to be connected to a second source layer of said another load thin film transistor;

forming a gate insulator for said load thin film transistor;

forming said third gate electrode on said gate insulator; and performing ion implantation with a first concentration of p-type impurity ions in alignment with said third gate electrode and said wiring layer to form said second source layer functioning said power supply line pattern and said second drain layer.

9. A method according to claim 8, wherein said step of forming a p-channel load thin film transistor further includes:

forming a resist pattern on said third gate electrode and a portion of said second drain layer; and performing ion implantation with a second concentration of p-type impurity ions using the resist pattern as a mask to form said second source layer functioning said power supply line pattern and said second drain layer, said second concentration being higher than said first concentration.

10. A method according to claim 8, wherein said step of forming a p-channel load thin film transistor further includes:

forming a fourth insulating film on said third gate electrode and said wiring layer to form side wall insulating films around of said third gate electrode; and performing ion implantation with a second concentration of p-type impurity ions using said third gate electrode, said side wall insulating films and said wiring layer as a mask to form said second source layer functioning said power supply line pattern and said second drain layer, said second concentration being higher than said first concentration.

* * * * *